US012589986B2

(12) United States Patent
Walton et al.

(10) Patent No.: US 12,589,986 B2
(45) Date of Patent: Mar. 31, 2026

(54) LOW VOLTAGE ELECTROSTATIC MEMS ACTUATORS FOR LARGE ANGLE TIP, TILT, AND PISTON BEAMSTEERING

(71) Applicant: Government of the United States, as represented by the Secretary of the Air Force, Wright-Patterson AFB, OH (US)

(72) Inventors: John PK Walton, Troy, OH (US); LaVern A Starman, Dayton, OH (US); David Torres Reyes, Springboro, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 323 days.

(21) Appl. No.: 18/421,596

(22) Filed: Jan. 24, 2024

(65) Prior Publication Data

US 2024/0158223 A1 May 16, 2024

Related U.S. Application Data

(60) Continuation-in-part of application No. 17/564,330, filed on Dec. 29, 2021, now abandoned, which is a
(Continued)

(51) Int. Cl.
*G02B 26/08* (2006.01)
*B81B 3/00* (2006.01)

(52) U.S. Cl.
CPC ........ *B81B 3/0043* (2013.01); *G02B 26/0833* (2013.01); *G02B 26/0841* (2013.01);
(Continued)

(58) Field of Classification Search
CPC ........... B81B 3/0043; B81B 2201/032; B81B 2201/042; B81B 2203/053;
(Continued)

(56) References Cited

U.S. PATENT DOCUMENTS 6,545,385 B2 4/2003 Miller et al.
6,600,851 B2 7/2003 Aksyuk et al.
(Continued)

OTHER PUBLICATIONS

Cowen et al., "PolyMUMPs™ Design Handbook, Revision 13.0.," MEMSCAP Inc., 3021 Cornwallis Road, Research Triangle Park, NC, (2011).
(Continued)

*Primary Examiner* — Euncha P Cherry
(74) *Attorney, Agent, or Firm* — AFMCLO/JAZ; Charles R. Figer, Jr.

(57) ABSTRACT

An actuator element of a MEMS device on a substrate able to create large, out-of-plane deflection includes two separated metallic layers contacting the substrate. The second metallic layer has a first portion contacting the substrate and a second portion having cantilevered over the substrate and first metallic layer. A first insulating layer contacts the cantilevered metallic layer on a bottom contacting surface and a second insulating layer contacting the cantilevered metallic layer on a portion of a top contacting surface. The second, cantilevered portion of the metallic layer is pre-stressed causing the distal end to deform away from the substrate. Applying a voltage potential between the first and second metallic layers creates an electrostatic field drawing the distal end toward the substrate.

14 Claims, 6 Drawing Sheets

Related U.S. Application Data division of application No. 16/052,018, filed on Aug. 1, 2018, now Pat. No. 11,279,613.

(60) Provisional application No. 62/702,595, filed on Jul. 24, 2018, provisional application No. 62/667,647, filed on May 7, 2018, provisional application No. 62/589,610, filed on Nov. 22, 2017, provisional application No. 62/587,734, filed on Nov. 17, 2017, provisional application No. 62/540,177, filed on Aug. 2, 2017.

(52) U.S. Cl.
CPC .... *G02B 26/0866* (2013.01); *B81B 2201/032* (2013.01); *B81B 2201/042* (2013.01); *B81B 2203/053* (2013.01); *B81B 2203/058* (2013.01)

(58) Field of Classification Search
CPC .......... B81B 2203/058; G02B 26/0833; G02B 26/0841; G02B 26/0866
See application file for complete search history.

(56) References Cited

U.S. PATENT DOCUMENTS

| | | | |
|---|---|---|---|
| 6,628,857 B1 | 9/2003 | Bonadeo et al. | |
| 6,632,373 B1 | 10/2003 | Rosa et al. | |
| 6,701,037 B2 | 3/2004 | Staple et al. | |
| 6,795,603 B2 | 9/2004 | Utsunomiya | |
| 6,829,069 B2 | 12/2004 | Buzzetta | |
| 7,005,775 B2 | 2/2006 | Wan | |
| 7,057,251 B2 | 6/2006 | Reid | |
| 7,148,603 B1 | 12/2006 | Gracia et al. | |
| 7,482,664 B2 * | 1/2009 | Sinclair | B81B 3/004 |
| | | | 257/414 |
| 7,677,742 B2 | 3/2010 | Hillmer et al. | |
| 8,537,446 B2 | 9/2013 | Lal et al. | |
| 9,664,896 B1 | 5/2017 | Yasumura | |
| 2010/0030627 A1 | 2/2010 | Lee et al. | |
| 2010/0033788 A1 | 2/2010 | Xie et al. | |

OTHER PUBLICATIONS

Todd et al., "A Multi-Degree-of-Freedom Micromirror Utilizing Inverted-Series-Connected Bimorph Actuators," J. of Optics A: Pure and Applies Optics, vol. 8, pp. S352-S359, 2006.

Wu et al., "A Tip-Tilt-Piston Micromirror Array for Optical Phased Array Applications," J. of Microelectromechanical Systems, vol. 19, No. 6, pp. 1450-1461, 2010.

Jia et al., "An Electrothermal Tip-Tilt-Piston Micromirror Based on Folded Dual S-Shaped Bimorphs," J. of Microelectromechanical Systems, vol. 18, No. 5, pp. 1004-1015, 2009.

Samuelson et al., "A Large Piston Displacement MEMS Mirror with Electrothermal Ladder Actuator Arrays for Ultra-Low Tilt Applications," J. of Microelectromechanical Systems, vol. 23, No. 1, pp. 39-49, 2014.

* cited by examiner

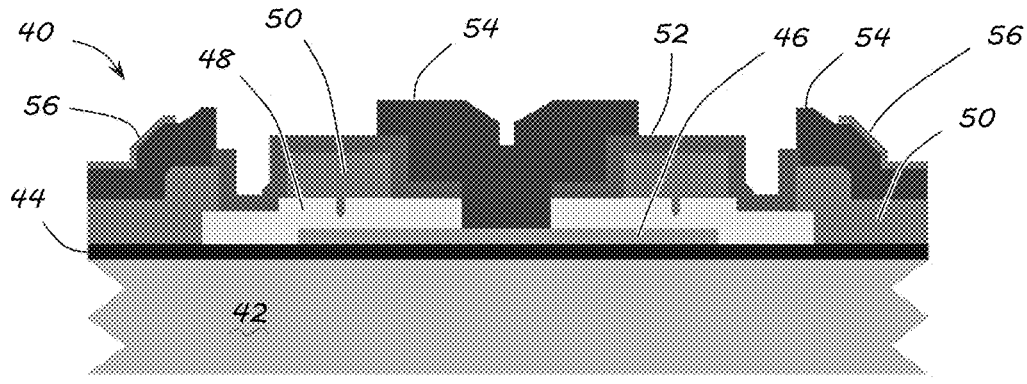

*FIG. 3A*

| MATERIAL LAYER | LAYER THICKNESS | LAYER DESCRIPTION |
|---|---|---|
| NITRIDE (44) | 0.6 μm | PROVIDE ELECTRICAL ISOLATION FROM WAFER |
| POLY0 (46) | 0.5 μm | ELECTRICAL LAYER FOR GROUND PLANE/ELECTRODE FORMATION |
| 1ST OXIDE (48) | 2.0 μm | FIRST SACRIFICIAL LAYER PROVIDEING GAP BETWEEN POLY0 AND POLY1 LAYERS |
| POLY1 (50) | 2.0 μm | FIRST MECHANICAL LAYER |
| 2ND OXIDE (52) | 0.75 μm | SECOND SACRIFICIAL LAYER PROVIDING GAP BETWEEN POLY1 AND POLY2 |
| POLY2 (54) | 1.5 μm | SECOND MECHANICAL LAYER |
| METAL (56) | 0.5 μm | ELECTRICAL CONTACT LAYER OR OPTICALLY REFLECTIVE SURFACE |

*FIG. 3B*

LOW VOLTAGE ELECTROSTATIC MEMS ACTUATORS FOR LARGE ANGLE TIP, TILT, AND PISTON BEAMSTEERING

CROSS-REFERENCE TO RELATED APPLICATIONS

This application is a continuation-in-part of U.S. application Ser. No. 17/564,330, which is a divisional of U.S. application Ser. No. 16/052,018, now U.S. Pat. No. 11,796, 613, entitled "MEMS Device for Large Angle Beamsteering, ", which claims the benefit of and priority to U.S. Provisional Application Ser. No. 62/540,177, entitled "Post-Processing Techniques on MEMS Foundry Fabricated Devices for Large Angle Beamsteering," filed on Aug. 2, 2017, and U.S. Provisional Application Ser. No. 62/587,734, entitled "Segmented Control of Electrostatically Actuated Bi-Morph Beams," filed on Nov. 17, 2017, and U.S. Provisional Application Ser. No. 62/589,610, entitled "Using Surface Micromaching to Create Large Tip, Tilt, and Piston MEMS Beamsteering Structures," filed on Nov. 22, 2017, and U.S. Provisional Application Ser. No. 62/667,647, entitled "Torsional Structures to Enable Large Angle Deflections," filed on May 7, 2018, and U.S. Provisional Application Ser. No. 62/702,595, entitled "Torsional Springs to Enable Large Angle Tip/Tilt Beamsteering using MEMS," filed on Jul. 24, 2018, the entireties of which are incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to MEMS devices and, more particularly, MEMS devices capable of large angle deflections.

DESCRIPTION OF THE RELATED ART

Within the past decade, numerous researches have invested time in the development of micro-electro-mechanical systems (MEMS) micromirror structures, which have the ability to deflect at large angles (greater than 20 degrees). These large tip/tilt micromirrors are ideal for many applications to include microscopy, biomedical endoscopy, laser communication, wavelength selectivity, optical tuning, scene generation and various other medical instrumentations. Although many of these research efforts exhibit large tip/tilt angles, they generally do not include a piston motion for optical correction requirements or exhibit high fill-factors for large area optical scanning applications.

There currently are no large angle electrostatic beamsteering approaches which exhibit large tip/tilt and piston motion while creating a >90% fill-factor. Current state of the art electrostatic designs have a maximum tip or tilt of ±28° for a single element but generally do not possess both capabilities. No approach with a tip or tilt angle of >10° are available which has a high fill-factor. Most if not all designs with a high fill-factor have tilt angles of less than 5°. Accordingly, there is a need in the art for MEMS micromirrors for large angle beamsteering for numerous broadband steering and imaging applications.

SUMMARY OF THE INVENTION

Embodiments of the invention address the need in the art by providing an actuator element of a MEMS device on a substrate to create large, out-of-plane deflection. The actuator element includes a first metallic layer contacting the substrate and a second metallic layer that has a first portion in contact with the substrate separated from the first metallic layer and a second portion having an end proximal to the first portion and distal end cantilevered over the substrate and first metallic layer. A first insulating layer contacts the second metallic layer on a bottom contacting surface of the cantilevered portion and a second insulating layer contacting the a top contacting surface of the cantilevered portion. The second portion of the metallic layer is prestressed causing the distal end to deform away from the substrate. And, applying a voltage potential between the first and second metallic layers creates an electrostatic field drawing the distal end toward the substrate.

In some embodiments the portion of the top contacting surface spans from the distal end to a location halfway between the proximal and distal ends.

In some embodiments the actuator element is held at a potential grounded state and wherein a voltage is applied to the first metallic layer under the second cantilevered portion of the second metallic layer creating the voltage potential.

In some embodiments the second portion of the metallic layer may be tensilely prestressed and in some of those embodiments, the material of the metallic layer may include gold, aluminum, chromium, titanium, platinum, copper, nickel, and combinations thereof.

In some embodiments, the material of the first and second insulating layers may include silicon dioxide, silicon nitride, hafnium oxide, aluminum oxide, and combinations thereof.

Embodiments of the invention may also include an actuator assembly where an end of an actuator element of a plurality of actuator elements near the first portion of the second portion of the second metallic layer is connect to the distal end of the second metallic layer of another actuator element of the plurality of actuator elements forming a chain. In some of these embodiments, an actuator element of the plurality of actuator elements may be held at a potential grounded state and wherein a voltage is applied to the first metallic layer under the second cantilevered portion of the second metallic layer creating the voltage potential. In other embodiments, the voltage potential applied to an actuator element of the plurality of actuator elements may be different from a voltage potential applied to another actuator element of the actuator elements.

Embodiments of the invention also provide a method of forming an actuator element. First, a first metallic layer and a first portion of a second metallic layer separated from the first metallic layer are deposited on a substrate. A sacrificial layer is then deposited proximate the first portion of the second metallic layer and on the substrate and first metallic layer. A first dielectric is deposited on the sacrificial layer and a second portion of the second metallic layer is deposited on the first dielectric. The second portion of the second metallic layer has an end proximal to and contacting at least part of the first portion of the second metallic layer. The second portion of the metallic layer spans from the proximal end to a distal end. A second dielectric is deposited on a portion of the second portion of the second metallic layer at the distal end. And, finally, the sacrificial layer is removed releasing the actuator element.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 3A illustrates the PolyMUMPs foundry fabrication layers for an exemplary device;

FIG. 3B contains a table with material layer descriptions and thicknesses of the PolyMUMP foundry fabrication for an exemplary device in FIG. 3A.

Figure 1A:
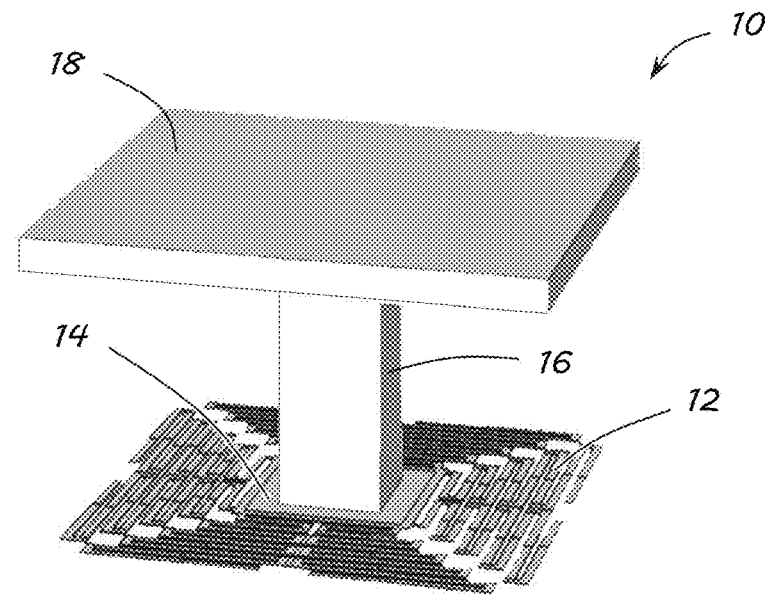
FIG. 1A illustrates an exemplary large angle beamsteering micromirror design concept using the center contact design approach.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Currently, MEMS micromirrors with large deflections with a greater than ±30° and exhibiting a high fill factor do not exist while also exhibiting a high fill-factor (>90%). The largest known deflections are ±30° for an electrothermal mirror with only tip, tilt functionality. Embodiments of the invention capitalize on several of the baseline common actuation techniques to create the desired tip, tilt, and piston motion for the MEMS micromirrors. Presently, the largest deflections in MEMS micromirrors is based on using magnetics as the actuation method; however the scan speed is several milliseconds which is typically to slow to meet many of the desired applications. Electrostatic methods are widely used in today's MEMS application regimes but generally for low tip, tilt, and piston deflections (<5°); however, similar approaches can be used so we will be leveraging some of these design concepts.

Thus an objective of embodiments of the invention is to enable new and improved beamsteering systems with large beamsteering angles, high scanning speeds, while exhibiting high fill-factor (>90%) arrays, which may be scalable to large aperture sizes as well as enabling a multi-beam scanning capability at low voltage. Embodiments of the invention may be used to replace many gimbal based systems in a variety of applications since the devices are nearly conformal, and can eliminate nearly all large, moving mechanical parts of the scanning/detector system. Embodiments of the invention would be applicable to EO/IR beamsteering systems, medical endoscopy, imaging and scene generation systems, laser communications, and multi-target search and track. Contemporary systems use gimbal systems, which are slow, with a single beamsteering direction, and no multi-target capability. Some advantages associated with the embodiments of the invention are that they can remove most mechanical/gimbal based systems on a platform, can enable multi-beam steering, operate at low voltages, system can be nearly conformal, adaptable and scalable to meet a wide range of applications. Some embodiments of the invention use MEMS to enable the large angle beamsteering, scalable with regard to array size, flexible with regards to material selection, wavelengths of interest, and deflection/steering angles while being ideal for wideband applications.

Embodiments of the invention utilize a multi-staged electrostatic MEMS actuation system which exhibits a large out-of-plane deflection which is the first stage in developing a large out-of-plane beamsteering technique. The large out-of-plane deflection is achieved by capitalizing on the materials inherent residual stress as well as the difference in the materials coefficient of thermal expansion (CTE) to form a traditional bimorph design. In addition, the material thickness, the beam lengths and widths, the number of beams, the Young's Modulus, and the variation of the deposition parameters of the multi-layers which make up the beams all significantly contribute to the peak out-of-plane deflection. The actuation system is made up of four individually controlled bimorph electrostatic actuators coupled to the bonding platform. The conceptual actuation of this device is through the biasing of a voltage between the beam metal and the underlying electrode, essentially creating a variable capacitor. As the bias voltage is increased, the electrostatic force generated begins to pull down the associated actuator, causing the system to tip or tilt. The actuators enable the system tip/tilt motion to angles of ±45 degrees as well as provide a piston motion if all four actuators are biased simultaneously. This is a low voltage (<100V) system but may be tailored to operate at a lower or higher voltage by modifying the physical structural dimensions as well as the material properties, i.e. Young's Modulas, length, width, and thickness of the beam structure which all significantly impact the mechanical restoring forces of the structure, making it easier or harder to bend. As stated, the overall system operates on electrostatics to pull down the actuators to create the required forces to tip/tilt or piston drive the actuation system. A preferred embodiment would encompass an array of these actuation structures which exhibit a high fill-factor >90% to mitigate signal loss and maximize beam reflection/detection. The actuation structure based on the bimorph design methodology is provided below.

Figure 1B:
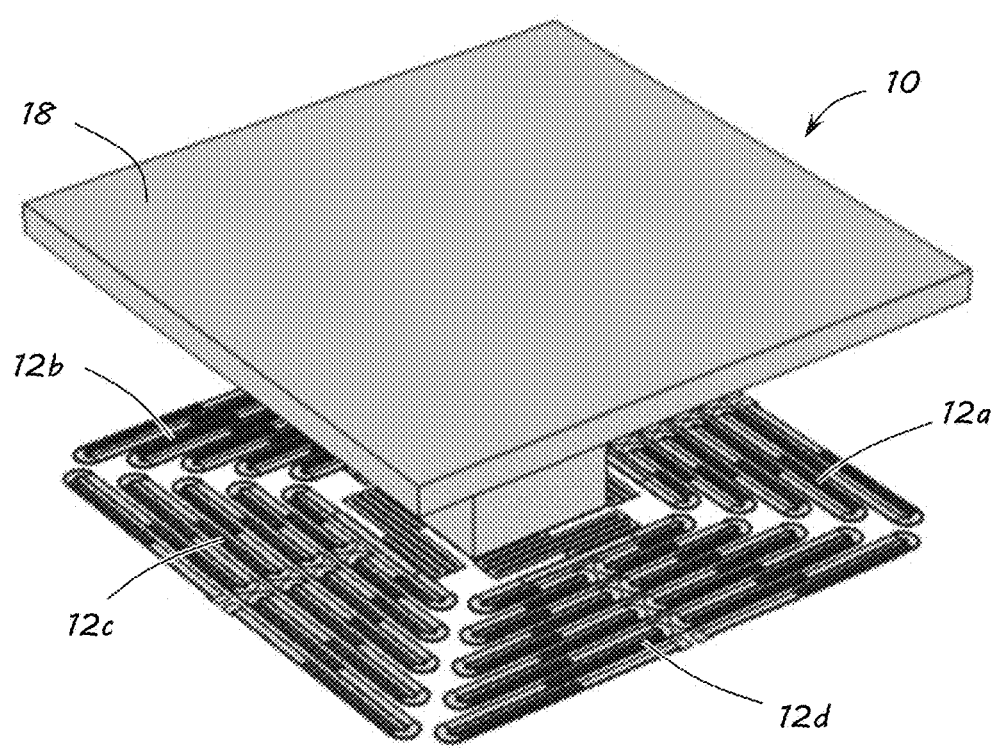
FIG. 1B illustrates another exemplary actuation assembly integrated with the micromirror-post assembly.
Figure 1C:
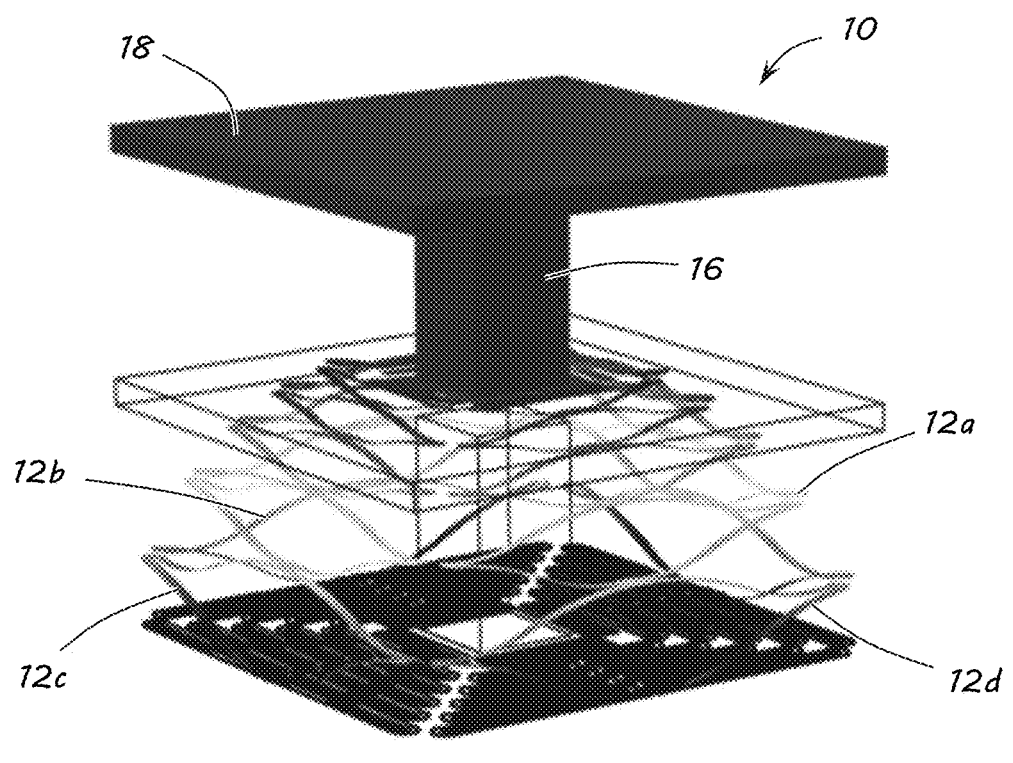
FIG. 1C illustrates a post release result of the systems showing an out-of-plane upward deflection as a result of the inherent residual stresses in the material layers as well as the different material CTE values.

FIGS. 1A-1C illustrate one of the structural concepts which uses the inherent residual stress in stacked material layers to capitalize on the different CTE of the selected materials. FIG. 1A illustrates the basic design concept 10 with the cantilever based array style beams 12 (ex 12a, 12b, 12c, and 12d in FIG. 1B) attached to a bonding platform 14. This bonding platform 14 is used to bond and support a micromirror pillar 16 and mirror plate 18 to enable the deflection and piston motion. In this embodiment, the entire structure used for actuation may be fabricated on a single wafer while the micromirror pillar 16 and mirror 18 may be fabricated from an SOI wafer. FIG. 1C illustrates the modeled upward deflection created by the inherent residual stress in the cantilever arrayed beams to provide the initial, post sacrificial released peak displacement. All remaining deflections and piston motion will occur due to controlled, user defined biases to determine the necessary cantilever beam deflection. The overall integration between the micromirror and the actuation technique is through basic adhesion bonding to the actuation platform via epoxy or through thermal compression bonding. The MEMS actuation structures can be fabricated via a commercial foundry or through our in-house fabrication efforts. COMSOL Multiphysics® results for the electrostatic actuator validate the upward deflection, which is possible using the as fabricated inherent residual stresses and different CTE values for the selected material layers.

Finite element modeling (FEM) techniques were used with some of the embodiments to assess beam deflections with respect to the selected materials and beam designs, determine associated bias voltage levels, and study the mirror curvature based on various reflective coatings. A series of conceptual actuation designs were initially fabricated in-house to assess design construct, fabrication processes, and material stress levels. The measured stress levels for the selected materials are used primarily to updated in the FEM modeling software to facilitate the accuracy of the device models. This was followed by fabricating the redesigns of the actuation systems to verify proper operation, estimated beam deflections, and bias voltages. Lastly, a mirror element was fabricated in SOI and tested for proper operation.

Figure 2A:
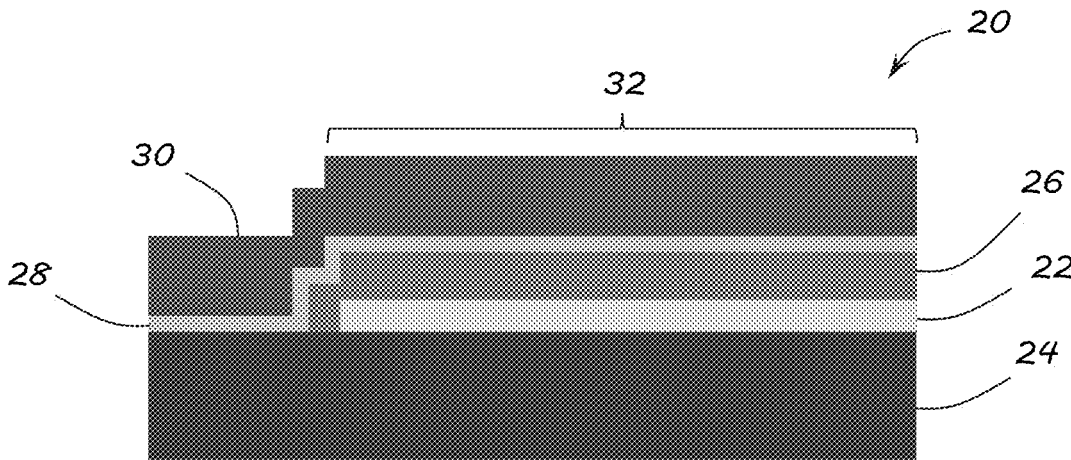
FIG. 2A illustrates an overall design concept of the actuation assembly for large out-of-plane deflections as deposited layers prior to release.
Figure 2B:
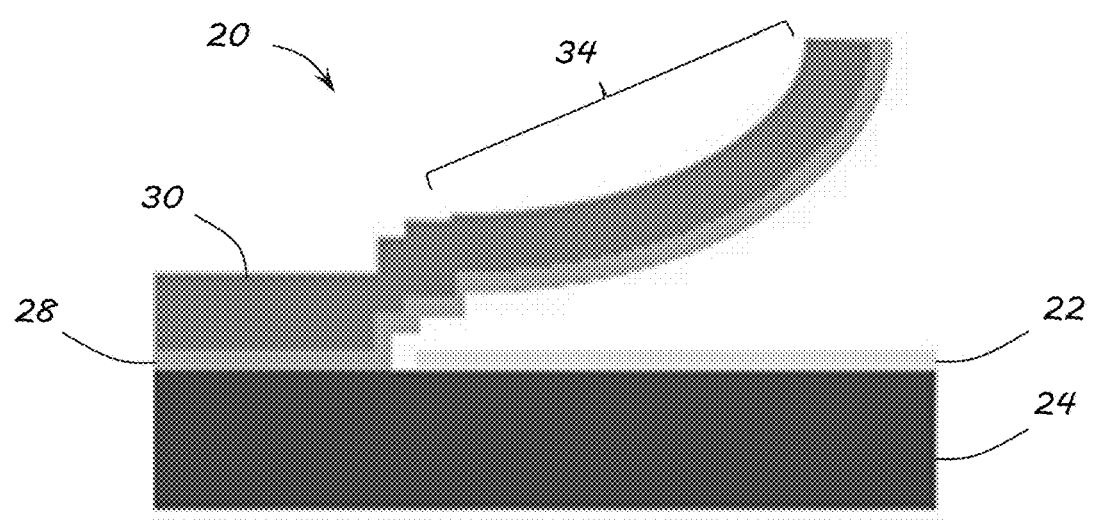
FIG. 2B illustrates a post released structure of FIG. 2A showing the out-of-plane upward deflection.
Figure 2C:
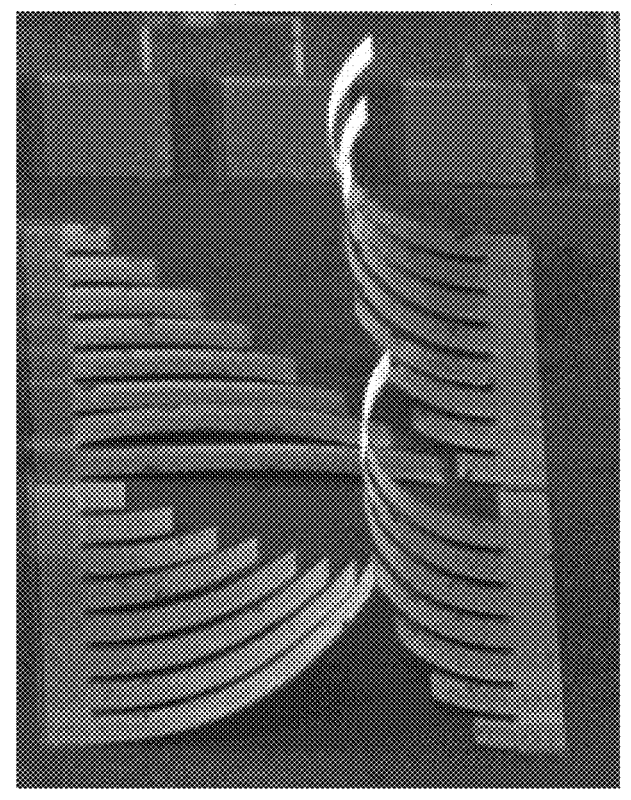
FIG. 2C illustrates an SEM image of bimorph cantilever beams for an actual structure in a released configuration.

As shown in FIGS. 1A and 1B above, to maximize the out-of-plane deflections, different material layers are used to create bimorph beam structures of an actuation assembly. The actuator design concept capitalizes on the residual stress and the coefficient of thermal expansion (CTE) differences between the layers. An exemplary layout 20 is shown in FIG. 2A. In the exemplary embodiment illustrated in FIG. 2A, an electrode 22 is formed on a substrate 24. A sacrificial layer 26 is formed over the electrode. An insulator 28 is then formed over the sacrificial layer 26 and a portion of the substrate 24. Finally, a metal 30 is formed over the insulator 28, where a portion 32 of the metal 30 is under a tensile stress. When the sacrificial layer 26 is removed, the configuration is "released" and a portion 34 of the metal layer 30 deforms due to the prestressed condition as shown in FIG. 2B. FIG. 2C shows a scanning electron microscope (SEM) image of the design concept as fabricated in the PolyMUMPs foundry process.

Embodiments of the electrostatic actuation system may be fabricated utilizing surface micromaching in which thin material layers are deposited and photolithography patterned and etched on the surface of the wafer. The electrostatic actuators may be developed via two processes, the Poly-MUMPs foundry process as outlined below and an in-house effort using aluminum, gold, silicon dioxide, silicon nitride or a variety of other material combinations. The primary component is to make sure the CTE difference between the material layers is as large as needed to achieve the desired out-of-plane deflections. This design concept can be used as a key component in a wide variety of large angle beam steering approaches for platforms and UAVs as well as various imaging systems.

The PolyMUMPs fabrication process is outlined in Cowen et al., "PolyMUMPs™ Design Handbook, Revision 13.0," MEMSCAP Inc., 3021 Cornwallis Road, Research Triangle Park, NC, (2011), which is incorporated by reference herein in its entirety. FIG. 3A illustrates a cross sectional view 40 of all deposition layers and the table in FIG. 3B outlines each layer thickness and layer functionality. The surface material layers are deposited by low pressure chemical vapor deposition (LPCVD). The sacrificial oxide layers, which consist of phosphosilicate glass (PSG) serve two purposes: 1) defines the gaps between structural layers, and 2) serves as the dopant source for the 1050° C. high temperature phosphorus diffusions to reduce the resistivity in the polysilicon structural layers. All surface layers are patterned using standard photolithography techniques and etched using Reactive Ion Etching (RIE). The final surface layer, a 0.5 µm-thick gold metallization layer with a 100 nm chrome adhesion layer is deposited and patterned using a standard lift-off technique. Lastly, a release etch is performed to remove the sacrificial oxide layers freeing the structural polysilicon layers (Poly1 and Poly2). The typical release etch is performed by immersing the die in room temperature hydrofluoric (49%) acid for 2-3 minutes, methanol rinses to stop the HF etch, and then a supercritical carbon dioxide ($CO_2$) rapid dry to minimize stiction of the actuation assemblies. One should note, for the electrostatic actuators designed using this foundry fabrication process, only the Poly0, Poly2 and gold layers are used to create the baseline foundation of the actuator which is then followed up with further post-processing device development through the addition of other material layers to achieve the desired bending moments to create the resulting out-of-plane deflections.

A MEMS commercial foundry may also be used in addition to in-house fabrication efforts to make these large out-of-plane structures. As illustrated in the various figures, a designer has a wide range of options to meet there desired application goals from the physical size of the device, to material selections, to residual stress levels within these layers. From these options, designers can create low angle tip/tilt/piston driven devices to very large out-of-plane structures which enable large angle tip/tilt and piston motion.

Figure 4A:
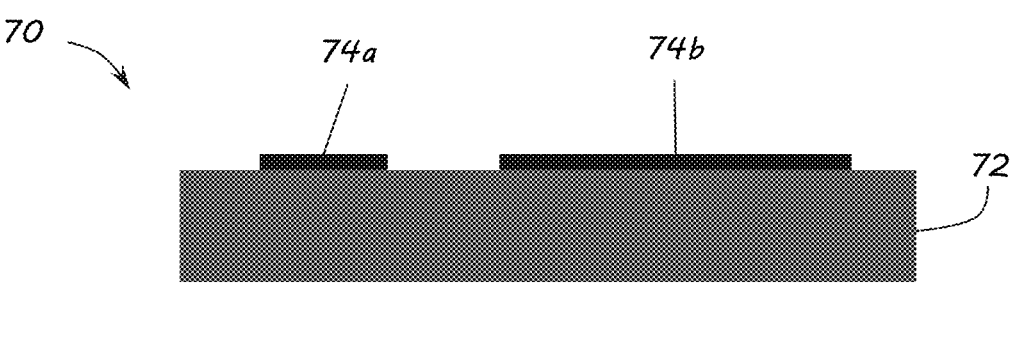
FIGS. 4A-4F illustrate a fabrication sequence of an electrothermal actuation assembly consistent with embodiments of the invention.
Figure 4B:
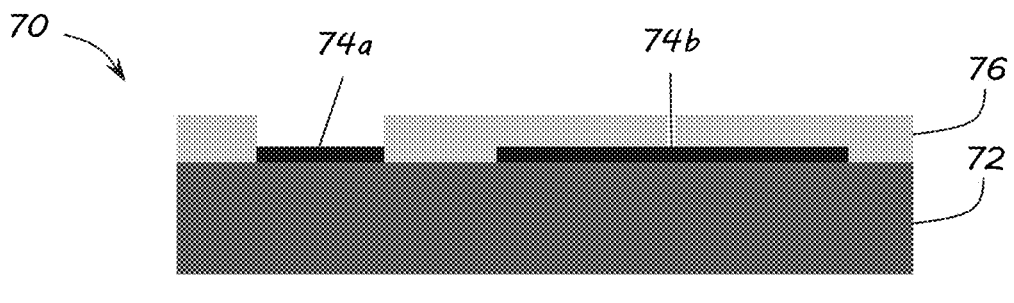
Figure 4C:
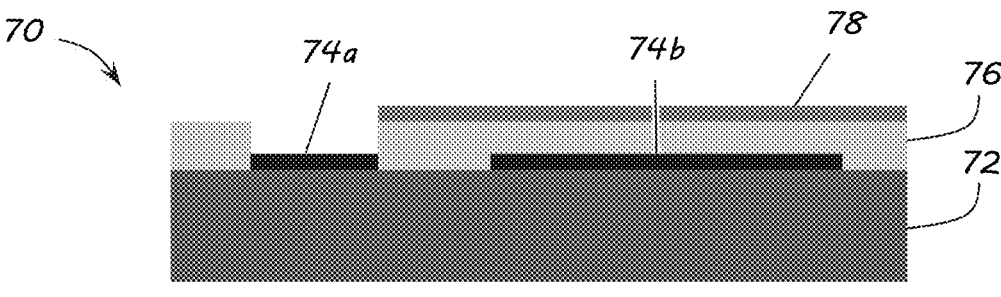
Figure 4D:
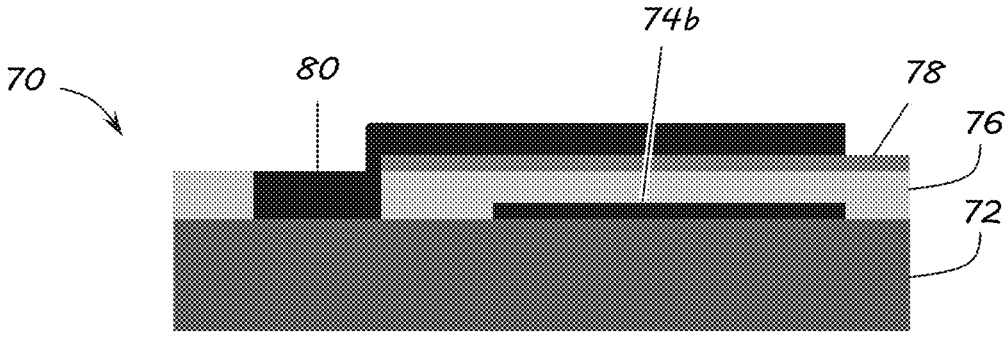
Figure 4E:
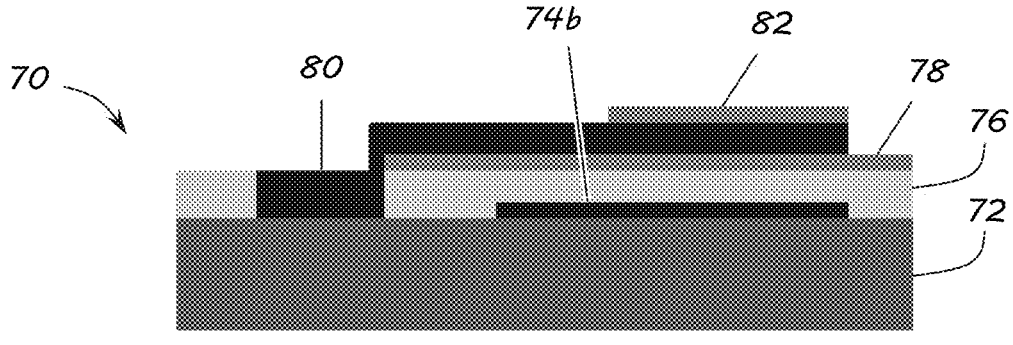
Figure 4F:
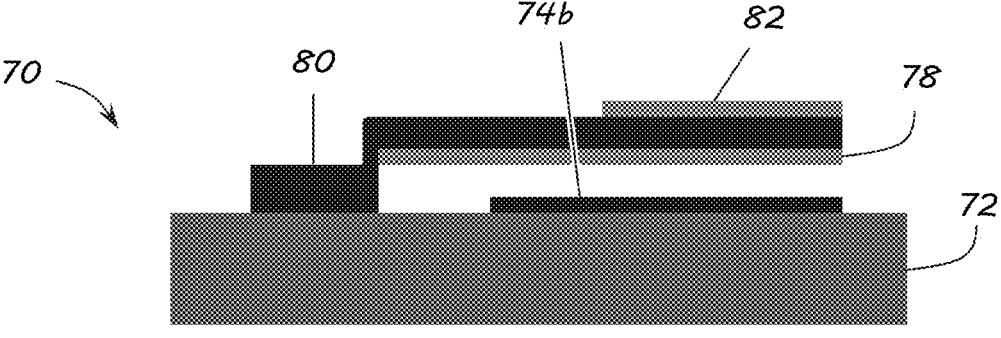

For the in-house electrostatic actuation assemblies, the fabrication is based on surface micromachining and generally standard MEMS fabrication. First, a series of masks are needed to define the construction of the beam structures and anchor positions. The fabrication sequence shown in FIGS. 4A-4F illustrate the complete fabrication process 70. The process begins in some embodiments with a glass wafer 72 and deposit a 0.5 µm metal layer 74a and 74b which is used as the bottom electrodes and wiring metal as shown in FIG. 4A. This is followed by spin casting a layer of PMGI at 4000 RPMs, and a layer of Shipley 1805 photoresist. The 1805 photoresist is exposed to UV and then developed. Following development, the stacked resist is exposed to deep UV to pattern the PMGI layer and is again developed as illustrated in FIG. 4B to form the sacrificial layer 76. The wafer is then placed on a 250° C. hotplate to reflow the PMGI layer. The reflow serves to round off the sharp edge profiles to mitigate high stress locations and enable sidewall deposition coverage for the actuation assembly. The bottom dielectric material is then PECVD deposited and patterned at 200° C. to form the bottom/base layer 78 of the beams of the actuation assembly and is shown in FIG. 4C. The next step is to deposit and pattern an approximate 1.0 μm metal layer 80 by evaporation to form the second layer of the bimorph structure as shown in FIG. 4D. Following the deposition of the beam metal layer 80, a second, top dielectric layer 82 of approximately 1.0 μm is deposited using PECVD and patterned to finish the three layer stacked beam structures which make up the actuation assembly and is shown in FIG. 4E. Lastly, the PMGI sacrificial layer is removed using an 1165 etchant (see FIG. 4F) which is then followed by a $CO_2$ critical point dry to fully release and dry the actuation assembly. All dielectric layers stated are etched using a reactive ion etch (RIE) system. Depending on the peak deflection needed, the dielectric materials and metal layers can be tailored via the material thickness and the selected material itself based on the residual stress and CTE of the materials.

There are a wide range of alternatives to this electrostatic actuator. All one needs to verify is the residual stresses and the CTE of the selected materials meet the application requirements. The greater the difference in CTE values, the greater the possible out-of-plane deflections which directly correlate to the tip/tilt beamsteering angles. In general, you need a metal layer to create the lower electrode and a conductive layer as part of the actuation platform to enable the electrostatic attraction for device operation. These metals could be aluminum, platinum, gold, or any other low resistive metal. The primary structural layer can also be made from a wide variety of materials such as polysilicon, silicon nitride, silicon dioxide, numerous polymers or any other structural material which has a fairly large Young's modulus. The higher the Young's modulus, the more rigid and stable the structure will be but there are limits as bending must occur to create the tip and tilting of the platform from the actuators. The primary applications currently for these types of structures are in the medical field for endoscopy and other imaging systems. These devices could also be used in scanners and likely EO/IR applications within the auto industry.

Electro-thermal devices operate by sending a current through the cantilever arms of the devices. This current produces heat in the material. This heat causes a temporary relaxation of the stresses engineered into the material which produced the initial vertical deflections and results in the downward actuation of device. In contrast, the embodiments of the electrostatic devices operate using a potential voltage difference between the cantilever arms and the substrate. Specifically, the device itself is held at a potential grounded state and a voltage is applied under the cantilever arms to create an electromagnetic (electrostatic) field which draws the two side together (like a magnet). For these embodiments to operate it does not relax the stress engineered into the cantilever, instead it needs to generate sufficient force to overcome the internal stresses and bend the cantilever back down. In some embodiments, different voltage potentials may be applied to different elements to control the deflection of the cantilever arms.

Much like the electro-thermal design there are a multitude of material choices to be made at each layer of the electrostatic design, but the material layouts and operations of them are very different. An electro-thermal device could not be actuated electrostatically and visa-versa.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. An actuator element of a MEMS device on a substrate to create large, out-of-plane deflection, the actuator element comprising:
 a first metallic layer contacting the substrate;
 a second metallic layer having a first portion contacting the substrate separated from the first metallic layer and a second portion having an end proximal to the first portion and distal end cantilevered over the substrate and first metallic layer;
 a first insulating layer contacting the second metallic layer on a bottom contacting surface of the second cantilevered portion from the proximal end to the distal end; and
 a second insulating layer contacting the second metallic layer on a portion of a top contacting surface at the distal end,
 wherein the second portion of the second metallic layer is prestressed causing the distal end to deform away from the substrate, and
 wherein applying a voltage potential between the first and second metallic layers creates an electrostatic field drawing the distal end toward the substrate.

2. The actuator element of claim 1, wherein the portion of the top contacting surface spans from the distal end to a location half way between the proximal and distal ends.

3. The actuator element of claim 1, wherein the actuator element is held at a potential grounded state and wherein a voltage is applied to the first metallic layer under the second cantilevered portion of the second metallic layer creating the voltage potential.

4. The actuator element of claim 1, wherein the second portion of the metallic layer is tensilely prestressed.

5. The actuator element of claim 1, wherein a material of the metallic layer is selected from a group consisting of gold, aluminum, chromium, titanium, platinum, copper, nickel, and combinations thereof.

6. The actuator element of claim 1, wherein a material of the first and second insulating layers is selected from a group consisting of silicon dioxide, silicon nitride, hafnium oxide, aluminum oxide, and combinations thereof.

7. An actuator assembly, comprising:
 a plurality of actuator elements, comprising:
 a first metallic layer contacting the substrate;
 a second metallic layer having a first portion contacting the substrate separated from the first metallic layer and a second portion having an end proximal to the first portion and distal end cantilevered over the substrate and first metallic layer;
 a first insulating layer contacting the second metallic layer on a bottom contacting surface of the second cantilevered portion from the proximal end to the distal end; and a second insulating layer contacting the second metallic layer on a portion of a top contacting surface at the distal end, wherein the second portion of the second metallic layer is prestressed causing the distal end to deform away from the substrate, and wherein applying a voltage potential between the first and second metallic layers creates an electrostatic field drawing the distal end toward the substrate;

wherein an end of an actuator element of the plurality of actuator elements near the first portion of the second portion of the second metallic layer is connect to the distal end of the second metallic layer of another actuator element of the plurality of actuator elements forming a chain.

8. The actuator assembly of claim 7, wherein the portion of the top contacting surface of an actuator element of the plurality of actuator elements spans from the distal end to a location half way between the proximal and distal ends.

9. The actuator assembly of claim 7, wherein an actuator element of the plurality of actuator elements is held at a potential grounded state and wherein a voltage is applied to the first metallic layer under the second cantilevered portion of the second metallic layer creating the voltage potential.

10. The actuator assembly of claim 9, where the voltage potential applied to an actuator element of the plurality of actuator elements is different from a voltage potential applied to another actuator element of the actuator elements.

11. The actuator element of claim 7, wherein the second portion of the metallic layer is tensilely prestressed.

12. The actuator element of claim 7, wherein a material of the metallic layer is selected from a group consisting of gold, aluminum, chromium, titanium, platinum, copper, nickel, and combinations thereof.

13. The actuator element of claim 7, wherein a material of the first and second insulating layers is selected from a group consisting of silicon dioxide, silicon nitride, hafnium oxide, aluminum oxide, and combinations thereof.

14. A method of forming an actuator element, the method comprising:

depositing a first metallic layer on a substrate;

depositing a first portion of a second metallic layer on the substrate separated from the first metallic layer;

depositing a sacrificial layer proximate the first portion of the second metallic layer and on the substrate and first metallic layer;

depositing a first dielectric on the sacrificial layer;

depositing a second portion of the second metallic layer on the first dielectric, the second portion of the second metallic layer having an end proximal to and contacting at least part of the first portion of the second metallic layer and a distal end, the second portion of the metallic layer spanning from the proximal end to the distal end;

depositing a second dielectric on a portion of the second portion of the second metallic layer at the distal end; and removing the sacrificial layer.

* * * * *